(12) United States Patent
Layadi et al.

(10) Patent No.: US 6,910,907 B2
(45) Date of Patent: Jun. 28, 2005

(54) CONTACT FOR USE IN AN INTEGRATED CIRCUIT AND A METHOD OF MANUFACTURE THEREFOR

(75) Inventors: Nace Layadi, Singapore (SG); Alvaro Maury, Villa des Flores (SG)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/716,299

(22) Filed: Nov. 18, 2003

(65) Prior Publication Data
US 2005/0106919 A1 May 19, 2005

(51) Int. Cl.[7] .................. H01R 13/28; H01R 25/00
(52) U.S. Cl. ........................................... 439/290
(58) Field of Search ........................ 439/290, 458, 439/464, 691; 257/621, 774

(56) References Cited

U.S. PATENT DOCUMENTS

| | | | | |
|---|---|---|---|---|
| 5,844,318 A | * | 12/1998 | Sandhu et al. | 257/774 |
| 6,781,215 B2 | * | 8/2004 | Heerman | 257/621 |
| 6,794,272 B2 | * | 9/2004 | Turner et al. | 438/459 |

* cited by examiner

*Primary Examiner*—Chandrika Prasad (57) ABSTRACT

The present invention provides a contact for use in an integrated circuit, a method of manufacture therefor, and an integrated circuit including the aforementioned contact. The contact, in accordance with the principles of the present invention, may include a via located in a substrate, and a contact plug located in the via, wherein the contact plug has a first portion having a notch removed therefrom and a second portion filling the notch.

20 Claims, 7 Drawing Sheets

CONTACT FOR USE IN AN INTEGRATED CIRCUIT AND A METHOD OF MANUFACTURE THEREFOR

TECHNICAL FIELD OF THE INVENTION

The present invention is directed, in general, to a contact and, more specifically, to a contact for use in an integrated circuit, a method of manufacture therefor, and an integrated circuit including the contact.

BACKGROUND OF THE INVENTION

Devices in the semiconductor industry continue to advance toward higher performance, while maintaining or even lowering the cost of manufacturing. Microminiaturization of semiconductor devices has resulted in higher performance, through increases in transistor speed and in the number of devices incorporated in a chip; however, this trend has also increased yield and reliability failures. As contact or via openings decrease in size, the aspect ratio, or the ratio of the depth of the opening to the diameter of the opening, also increases. With a higher aspect ratio, the use of aluminum-based metallization to fill the contact opening, results in electromigration and reliability failures. To alleviate reliability failures, the semiconductor industry has evolved to the use of tungsten, in certain devices, for filling narrow but deep contact or via openings.

The switch to tungsten filled contact openings takes advantage of the improved conformal, or step, coverage that results from the use of a plasma enhanced chemical vapor deposition (PECVD) process. In addition, tungsten's high current carrying characteristics reduce the risk of electromigration failure. The conventional method of forming tungsten plugs in vias includes plasma etching of vias or contacts, photoresist striping and cleaning, adhesion layer and barrier metal deposition by physical vapor deposition (PVD) and tungsten deposition by PECVD. Typical adhesion and barrier materials used may consist of a stack of titanium and titanium nitride, respectively. The titanium reduces the contact resistance of the interconnect, and the titanium nitride is a protective layer against titanium attack by a tungsten hexaflouride gas that is used during tungsten deposition. In addition, tungsten adheres to titanium nitride very well, resulting in a mechanically stable tungsten plug.

Unfortunately, after tungsten plug filling, voids, or so-called tungsten seams, are often observed in the tungsten material. This is particularly the case when the etched via profiles are straight. Such tungsten seams are commonly exposed during subsequent processing, such as during processes designed to remove unwanted tungsten from regions other then the contact opening. Moreover, in certain situations the size of the tungsten seam is increased due to exposure to the removal process. This often creates a difficult topology for subsequent metallization coverage as well as electrical device degradation, which is especially apparent as leakage in metal-oxide-metal MOM capacitor structures.

Therefore, processes have been developed, either attempting to create seamless tungsten contact opening fills or repairing the seam or void in the tungsten fill. For example, one attempt involves altering the via etch profile so as to assume a tapered profile, thereby reducing the tungsten seam and allowing better tungsten fill. The tapered via profile helps reduce many of the tungsten seam issues, however, it often leads to increased contact resistance, which is also very undesirable.

Accordingly, what is needed in the art is a contact structure and method of manufacture therefor that does not experience the tungsten "seam" problems, as experienced in the prior art.

SUMMARY OF THE INVENTION

To address the above-discussed deficiencies of the prior art, the present invention provides a contact for use in an integrated circuit, a method of manufacture therefor, and an integrated circuit including the aforementioned contact. The contact, in accordance with the principles of the present invention, may include a via located in a substrate, and a contact plug located in the via, wherein the contact plug has a first portion having a notch removed therefrom and a second portion filling the notch.

As previously mentioned, the present invention also provides a method form manufacturing the contact disclosed above. Among other steps, the method includes forming a via in a substrate, and placing a contact plug in the via, wherein the contact plug has a first portion having a notch removed therefrom and a second portion filling the notch.

Additionally, the present invention provides an integrated circuit including the aforementioned contact. The integrated circuit, among other elements, includes: (1) transistors located over a substrate, (2) an interlevel dielectric layer located over the transistors, the interlevel dielectric layer having a contact for contacting the transistors located therein, the contact including a via located in the interlevel dielectric layer and a contact plug located in the via, wherein the contact plug has a first portion having a notch removed therefrom and a second portion filling the notch.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
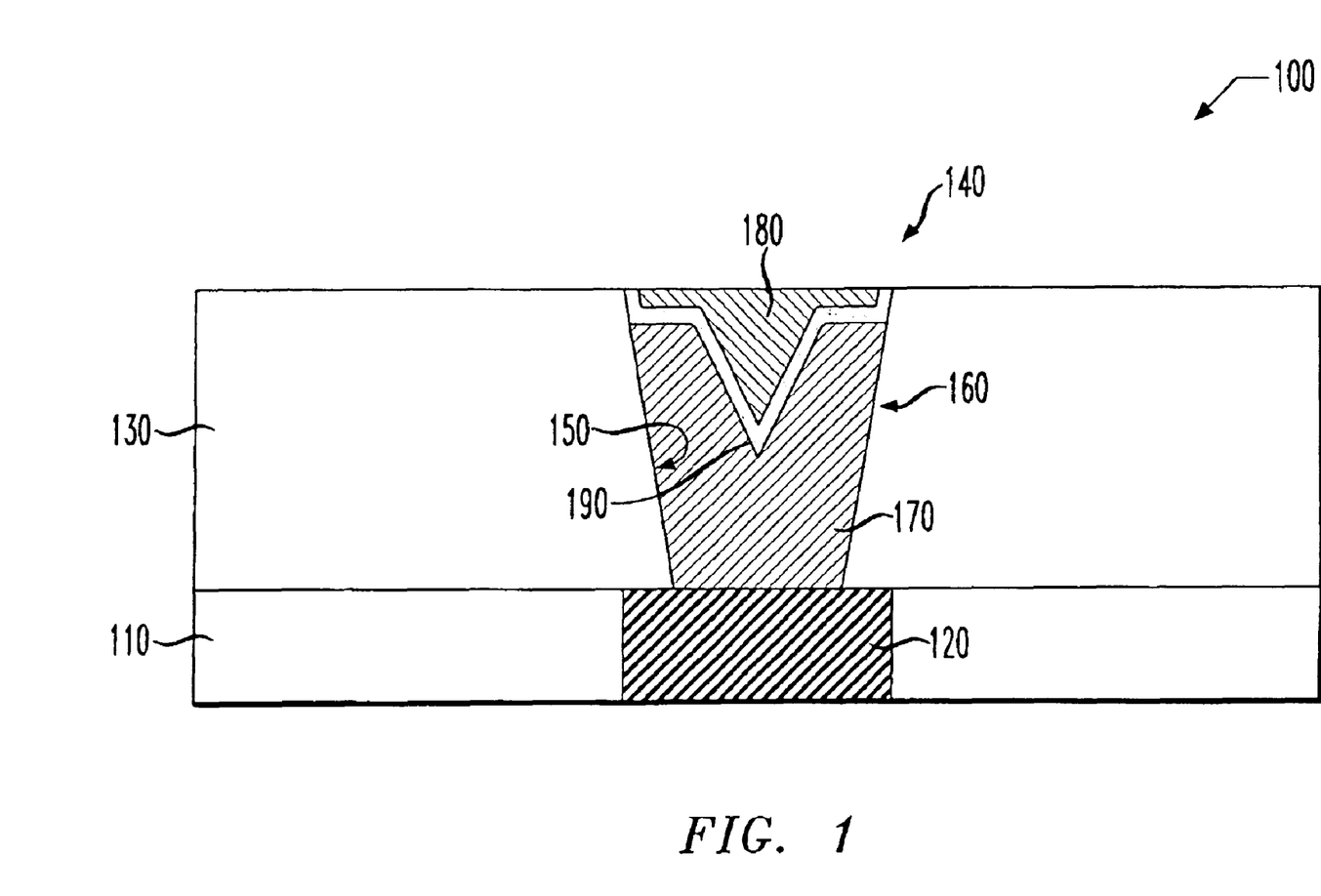
FIG. 1 illustrates a cross-sectional view of one embodiment of a portion of an integrated circuit constructed according to the principles of the present invention.

Referring initially to FIG. 1, illustrated is a cross-sectional view of one embodiment of a portion of an integrated circuit 100 constructed according to the principles of the present invention. In the embodiment illustrated in FIG. 1, the integrated circuit 100 includes a dielectric layer 110 having a conductive feature 120 located therein. The dielectric layer 110 might be an interlevel dielectric layer and the conductive feature 120 might be a runner located within the dielectric layer 110 for connecting various features in the integrated circuit 100. Other dielectric layers and conductive features are within the scope of the present invention.

Located over the dielectric layer 110 and the conductive feature 120 is a substrate 130. The substrate 130, similar to the dielectric layer 110, may comprise an interlevel dielectric layer. However, the substrate 130 may comprise other layers and stay within the scope of the present invention. Located within the substrate 130 and over the conductive feature 120 is a contact 140. The contact 140 is configured to provide electrical contact to the conductive feature 120.

In the embodiment illustrated in FIG. 1, the contact 140 includes a via 150 located within the substrate 130. Located within the via 150 is a contact plug 160. The contact plug 160 constructed in accordance with the principles of the present invention includes a first portion 170, wherein the first portion 170 has a notch removed therefrom. This notch is present as a result of the first portion originally including a seam, and it subsequently being etched away, thus resulting in the notch shown.

As shown in FIG. 1, the contact plug 160 further includes a second portion 180. FIG. 1 illustrates that the second portion 180 may be used to completely fill the notch of the first portion 170. Notice how the profile of the notch of the first portion 170 is dissimilar to the profile of the trench 150. That is, the notch of the first portion 170, and thus the second portion 180 that fills the notch, is not conformal with the sidewalls of the trench as might be seen in traditional devices. This non-conformal second portion 180 is a result of the unique method for manufacturing the contact 140.

Optionally located between the first and second portions 170, 180, is an adhesion layer 190. The adhesion layer 190, which may comprise a titanium/titanium nitride adhesion layer or other similar materials, may be used to provide the requisite adhesion between the first and second portions 170, 180. Even though the first and second portions 170, 180, may comprise the same material (e.g., tungsten), the adhesion layer 190 is desired in certain applications.

What results is a contact 140 being substantially free of a seam or void. As the contact 140 is substantially free of a seam or void, as compared to many of the prior art structures, especially those using tungsten as the conductive material, it does not experience the topology and electrical device degradation issues experienced by the prior art structures. Additionally, the contact 140 is easy to manufacture and can be smoothly incorporated into the already existing process flow.

Figure 2:
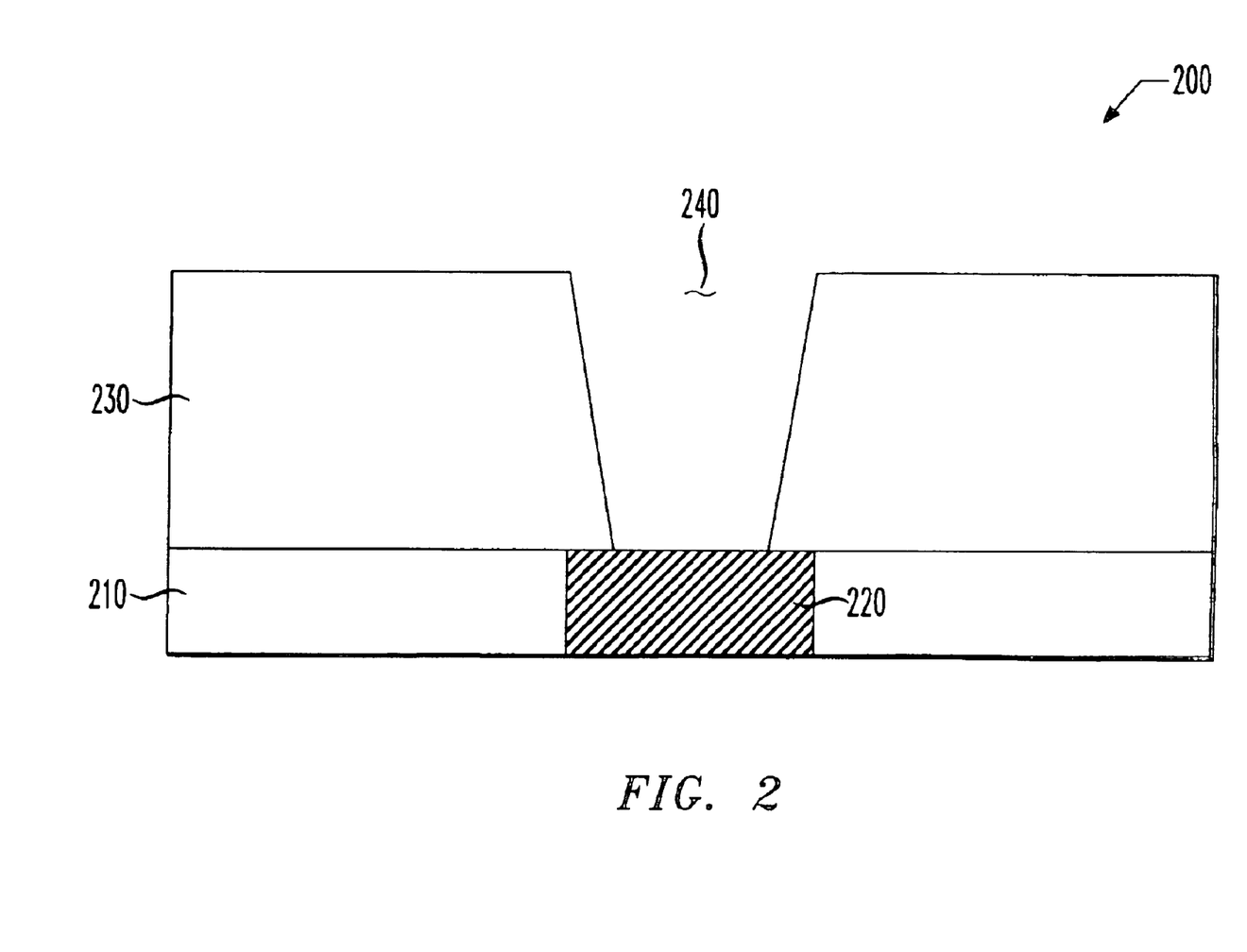
FIG. 2 illustrates a cross-sectional view of a partially completed integrated circuit at an initial stage of manufacture.

Turning now to FIGS. 2–6, illustrated are cross-sectional views of detailed manufacturing steps instructing how one might, in an advantageous embodiment, manufacture an integrated circuit similar to the integrated circuit 100 depicted in FIG. 1. FIG. 2 illustrates a cross-sectional view of a partially completed integrated circuit 200 at an initial stage of manufacture. The partially completed integrated circuit 200 includes a dielectric layer 210 having a conductive feature 220 located therein. As previously recited, the dielectric layer 210 could be an interlevel dielectric layer or another similar layer, as well as the conductive feature 220 could be a trace, interconnect, etc.

Located over the dielectric layer 210 and the conductive feature 220 is a substrate 230. More often than not the substrate 230 is an interlevel dielectric layer. It should be noted, however, that the substrate 230 could be any layer located within an integrated circuit, and particularly any insulative layer.

Conventionally formed within the substrate 230 in the embodiment shown and discussed with respect to FIG. 2 is a trench 240. The trench 240 is a standard trench that might be used in an integrated circuit to connect various layers therein. For example, a trench having an opening width ranging from about 100 nm to about 300 nm, and a depth ranging from about 400 nm to about 1200 nm, or other dimensions, could be used.

While not shown, the trench could be formed by patterning the blanket substrate 230 using photoresist and/or a hardmask layer. As those skilled in the art understand the various number of ways the trench 240 may be formed, no further detail is required.

Figure 3:
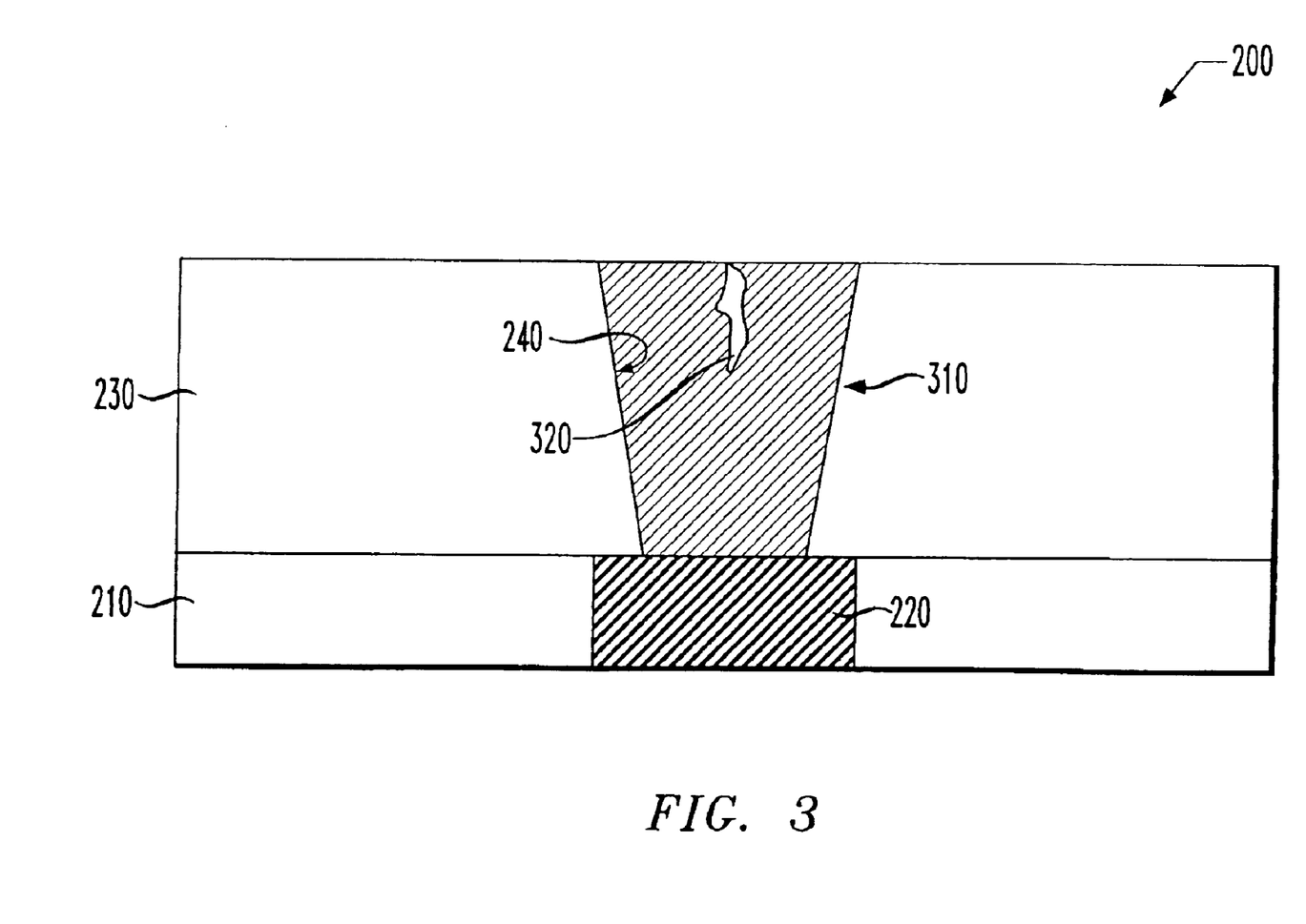
FIG. 3 illustrates a cross-sectional view of the partially completed integrated circuit illustrated in FIG. 2 after depositing a layer of conductive material, such as tungsten, within the trench, and thereafter polishing it back, resulting in an initial contact plug.

Turning now to FIG. 3, illustrated is a cross-sectional view of the partially completed integrated circuit 200 illustrated in FIG. 2 after depositing a layer of conductive material, such as tungsten, within the trench 240, and thereafter polishing it back, resulting in an initial contact plug 310. Notice how the initial contact plug 310 of FIG. 3 has a seam or void 320 located therein. As is often the case, this seam or void 320 is a result of the type of conductive material used to fill the trench 240. Tungsten, for example, is known for forming such seams or voids 320. Unfortunately, these seams or voids 320 are highly undesirable.

Figure 4:
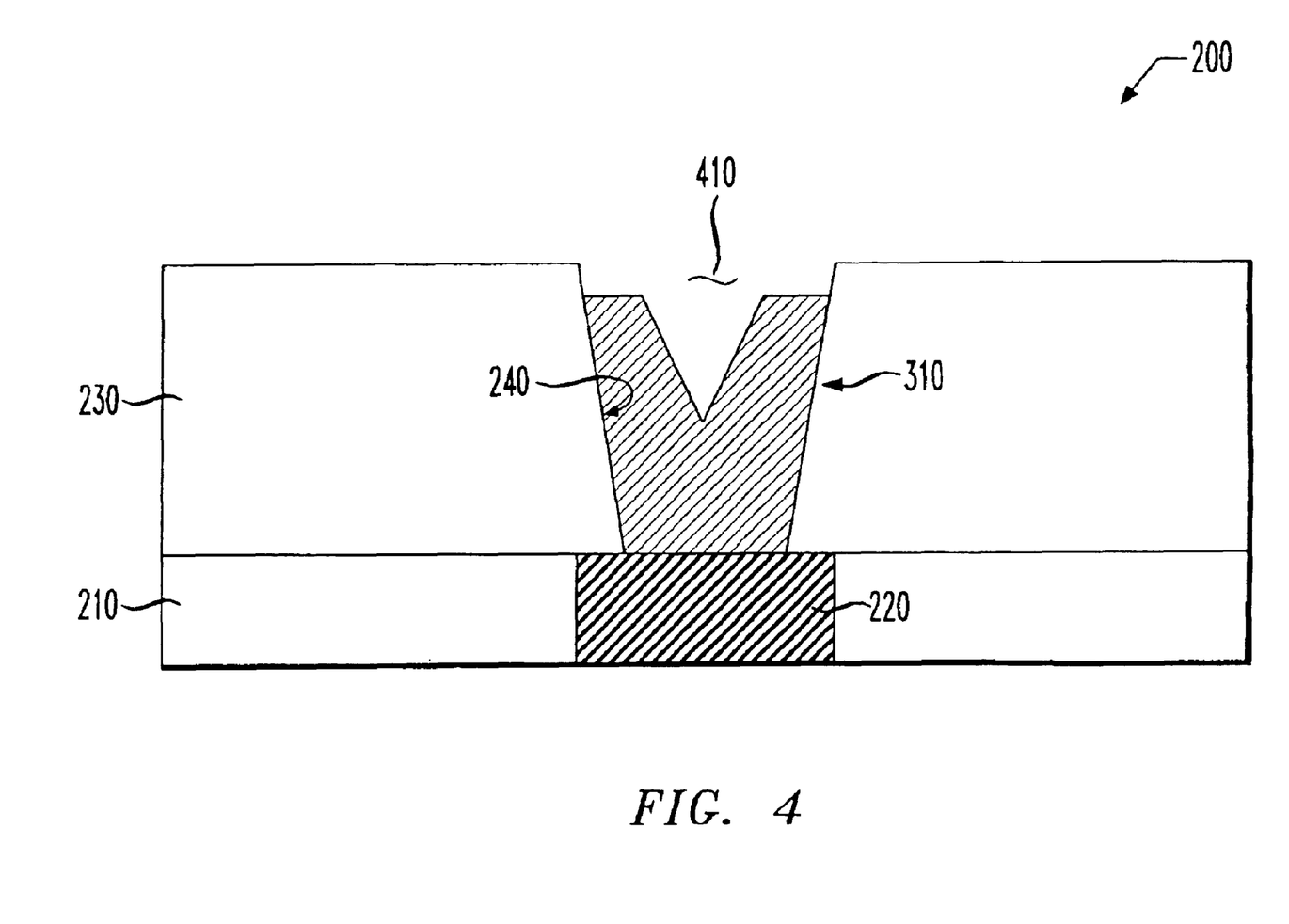
FIG. 4 illustrates a cross-sectional view of the partially completed integrated circuit illustrated in FIG. 3 after etching a notch from the initial contact plug.

Turning now to FIG. 4, illustrated is a cross-sectional view of the partially completed integrated circuit 200 illustrated in FIG. 3 after etching a notch 410 from the initial contact plug 310. The notch 410, which attempts to remove at least a portion of the seam or void 320, or alternatively an entire portion of the seam or void 320, typically has a profile that is dissimilar to the profile of the trench 240. For example, a V-shaped notch positioned only where the previous seam of void 320 was located, may be used in an exemplary embodiment. Other notch shapes, however, could also be used.

The notch 410 optimally has an opening width that ranges from about 50 nm to about 150 nm. Similarly, the notch 410 may have a depth ranging from about 20 nm to about 600 nm. This depth may vary as long as it encompasses a large portion of the seam or void 320, or optimally the entire portion of the seam or void 320.

Those skilled in the art understand the various techniques that could be used to create the notch 410. In one embodiment of the invention a protective mask is used to isolate the initial contact plug 310, while a chemical etch is subjected thereto. For example a reactive ion etch (RIE) or other similar etch could be used.

Figure 5:
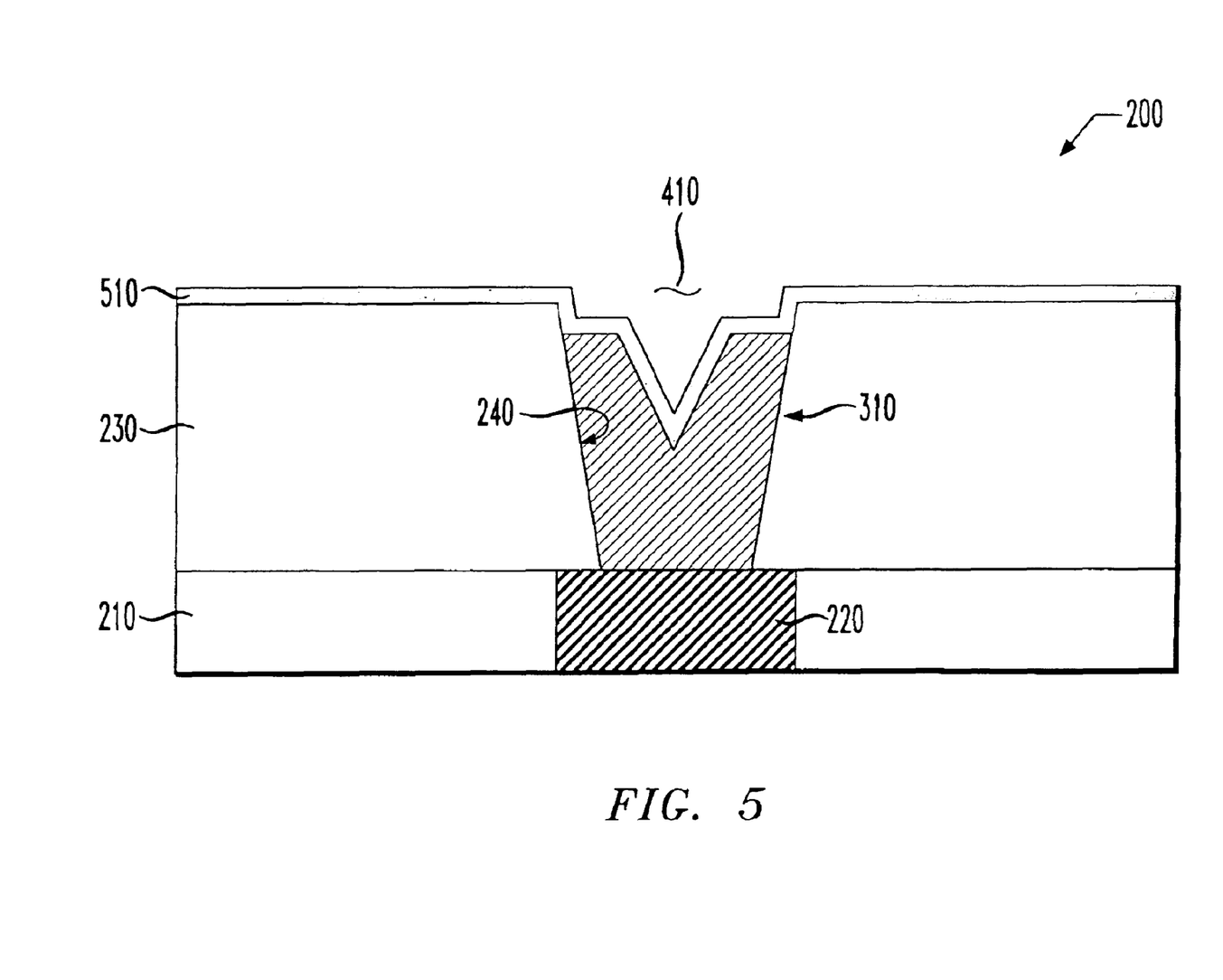
FIG. 5 illustrates a cross-sectional view of the partially completed integrated circuit illustrated in FIG. 4 after an optical adhesion layer has been formed over the substrate and within the notch created in the initial contact plug.

Turning now to FIG. 5, illustrated is a cross-sectional view of the partially completed integrated circuit 200 illustrated in FIG. 4 after an optional adhesion layer 510 has been formed over the substrate 230 and within the notch 410 created in the initial contact plug 310. The adhesion layer 510 in one embodiment comprises a titanium/titanium nitride adhesion layer having a thickness ranging from about 5 nm to about 15 nm. Other materials, as well as other thicknesses, could also be used. As the adhesion layer 510 is a conventional adhesion layer, it may be formed using a number of different conventional processes. For example, a conventional chemical vapor deposition (CVD), physical vapor deposition (PVD) or other similar deposition process could be used.

Figure 6:
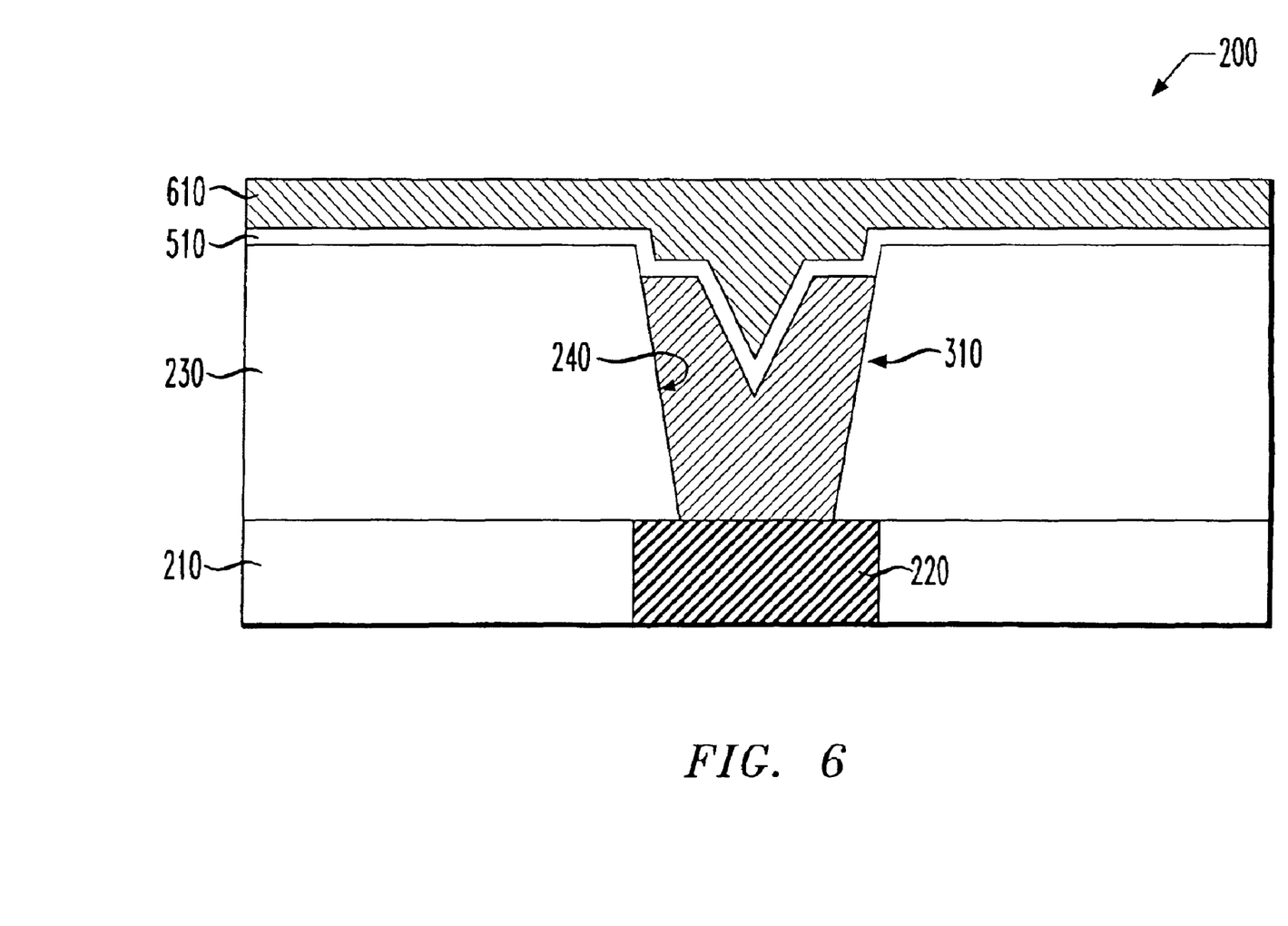
FIG. 6 illustrates a cross-sectional view of the partially completed integrated circuit illustrated in FIG. 5 after forming a second conductive material over the adhesion layer and filling the notch in the initial contact plug.

Turning now to FIG. 6, illustrated is a cross-sectional view of the partially completed integrated circuit 200 illustrated in FIG. 5 after forming a second conductive material 610 over the adhesion layer 510 and filling the notch 410 in the initial contact plug 310. The second conductive material 610, in an exemplary embodiment, comprises a similar material as the initial contact plug 310. For example, tungsten could be a good choice as both the initial contact plug 310 and the second conductive material 610. Other materials are, however, within the scope of the present invention, including different materials for the different portions.

The second conductive material 610 may be formed using similar processes as the initial contact plug 310. Additionally, the second conductive material 610 may be formed having a thickness ranging from about 50 nm to about 150 nm, or other thicknesses outside that range. Nonetheless, it is important that the second conductive material 610 substantially fill the notch 410.

After completing the partially completed integrated circuit 200 illustrated in FIG. 6, the second conductive material 610 may be polished. What results is a completed integrated circuit, including a contact plug located within a via, wherein the contact plug has a first portion with a notch removed therefrom, and a second portion filling the notch. Such a device could be similar to the integrated circuit 100 illustrated in FIG. 1.

Figure 7:
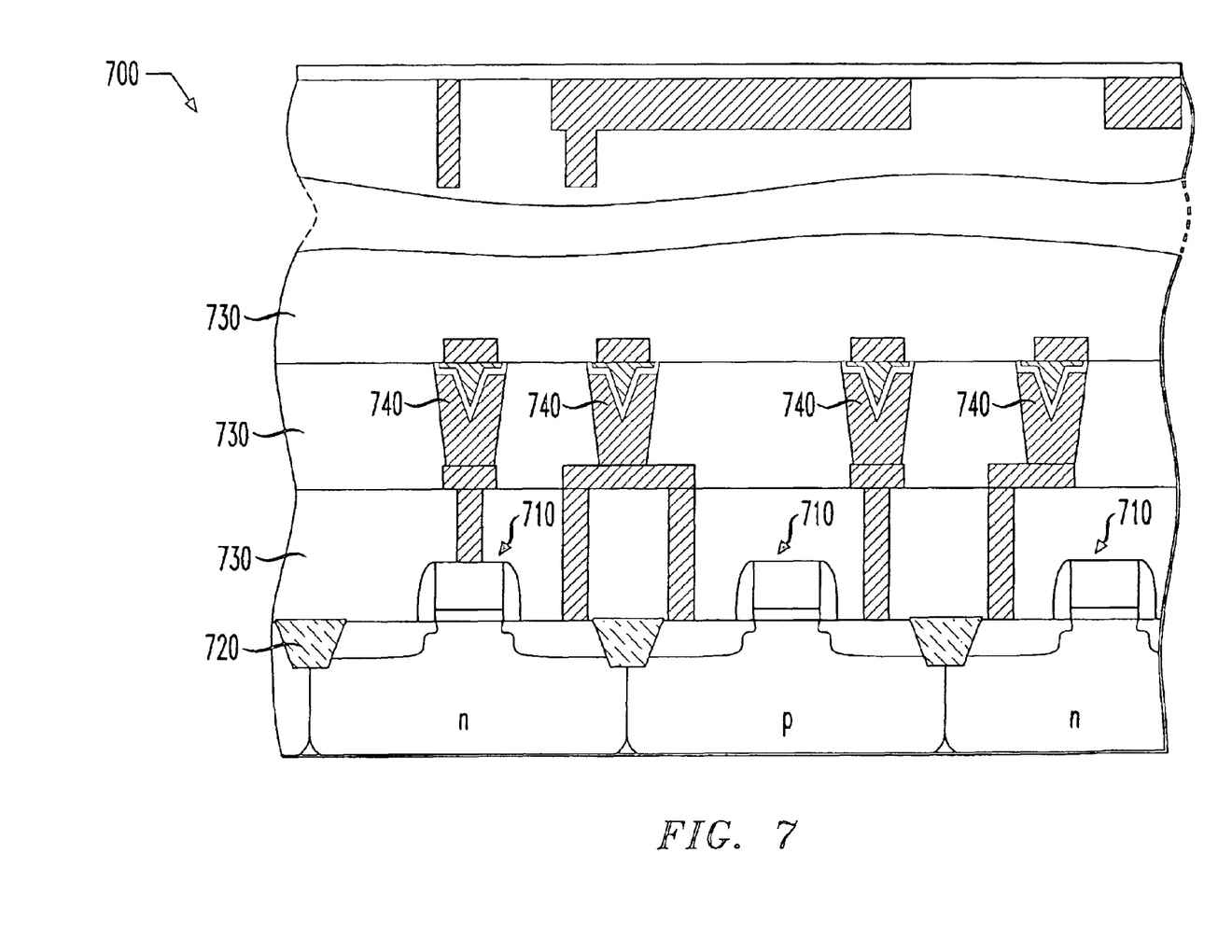
FIG. 7 illustrates a cross-sectional view of an integrated circuit (IC) incorporating contacts constructed according to the principles of the present invention.

Referring finally to FIG. 7, illustrated is a cross-sectional view of an integrated circuit (IC) 700 incorporating contacts constructed according to the principles of the present invention. The IC 700 may include devices, such as transistors used to form CMOS devices, BiCMOS devices, Bipolar devices, or other types of devices. The IC 700 may further include passive devices, such as inductors or resistors, or it may also include optical devices or optoelectronic devices. Those skilled in the art are familiar with these various types of devices and their manufacture.

In the particular embodiment illustrated in FIG. 7, the IC 700 includes semiconductor devices 710 located between isolation structures 720. The IC 700 of FIG. 7 further includes dielectric layers 730 located over the semiconductor devices 710. Additionally, contacts 740 constructed in accordance with the principles of the present invention are located within the dielectric layers 730 to interconnect various devices, thus, forming the operational IC 700.

Although the present invention has been described in detail, those skilled in the art should understand that they can make various changes, substitutions and alterations herein without departing from the spirit and scope of the invention in its broadest form.

What is claimed is:

1. A contact for use in an integrated circuit, comprising:
   a via located in a substrate; and
   a contact plug located in said via, wherein said contact plug has a first portion having a notch removed therefrom and a second portion filling said notch, and wherein a geometric shape of a cross-section of said second portion is non-conformal to a geometric shape of a cross-section of said via.

2. The contact as recited in claim 1 wherein said first and second portions comprise tungsten.

3. The contact as recited in claim 1 wherein said notch has a depth ranging from about 20 nm to about 600 nm.

4. The contact as recited in claim 1 wherein an opening of said notch has an width ranging from about 50 nm to about 150 nm.

5. The contact as recited in claim 1 further including an adhesion layer located within said notch and between said first and second portions.

6. The contact as recited in claim 5 wherein said adhesion layer has a thickness ranging from about 5 nm to about 15 nm.

7. The contact as recited in claim 5 wherein said adhesion layer is a titanium/titanium nitride adhesion layer.

8. The contact as recited in claim 1 being substantially free of a seam or void.

9. A method for manufacturing a contact for use in an integrated circuit, comprising:
   forming a via in a substrate; and
   placing a contact plug in said via, wherein said contact plug has a first portion having a notch removed therefrom and a second portion filling said notch, and wherein a geometric shape of a cross-section of said second portion is non-conformal to a geometric shape of a cross-section of said via.

10. The method as recited in claim 9 wherein said placing includes etching said notch within said first portion and subsequently depositing said second portion within said notch.

11. The method as recited in claim 9 wherein said placing a contact plug having first and second portions include placing a contact plug having first and second tungsten portions.

12. The method as recited in claim 9 wherein said notch has a depth ranging from about 20 nm to about 600 nm.

13. The method as recited in claim 9 wherein an opening of said notch has an width ranging from about 50 nm to about 150 nm.

14. The method as recited in claim 9 further including depositing an adhesion layer within said notch and between said first portion and said second portion.

15. The method as recited in claim 14 wherein depositing an adhesion layer includes depositing an adhesion layer having a thickness ranging from about 5 nm to about 15 nm.

16. The method as recited in claim 14 wherein depositing an adhesion layer includes depositing a titanium/titanium nitride adhesion layer.

17. The method as recited in claim 9 wherein said placing includes placing a contact plug in said via being substantially free of a seam or void.

18. An integrated circuit, comprising:

transistors located over a substrate; and an interlevel dielectric layer located over said transistors, said interlevel dielectric layer having a contact for contacting said transistors located therein, said contact including;
   a via located in said interlevel dielectric layer; and
   a contact plug located in said via, wherein said contact plug has a first portion having a notch removed therefrom and a second portion filling said notch, and wherein a geometric shape of a cross-section of said second portion is non-conformal to a geometric shape of a cross-section of said via.

19. The integrated circuit as recited in claim 18 further including an adhesion layer located within said notch and between said first portion and said second portion.

20. The integrated circuit as recited in claim 18 wherein said transistors are selected from the group consisting of:

CMOS devices;

BiCMOS devices; and bipolar devices.

* * * * *